(12) United States Patent
Maekawa et al.

(10) Patent No.: US 6,595,220 B2
(45) Date of Patent: Jul. 22, 2003

(54) APPARATUS FOR CONVEYING A WORKPIECE

(75) Inventors: Toshiro Maekawa, Sagamihara (JP); Satomi Hamada, Fujisawa (JP); Riichiro Aoki, Tokyo (JP); Shoichi Kodama, Tokyo (JP); Hiromi Yajima, Yokohama (JP)

(73) Assignees: Ebara Corporation, Tokyo (JP); Kabushiki Kaisha Toshiba, Kawasaki (JP)

(*) Notice: Subject to any disclaimer, the term of this patent is extended or adjusted under 35 U.S.C. 154(b) by 144 days.

(21) Appl. No.: 09/797,822

(22) Filed: Mar. 5, 2001

(65) Prior Publication Data

US 2001/0009157 A1 Jul. 26, 2001

Related U.S. Application Data

(62) Division of application No. 08/868,889, filed on Jun. 4, 1997, now Pat. No. 6,221,171.

(30) Foreign Application Priority Data

Jun. 4, 1996 (JP) ............................................... 7-163942

(51) Int. Cl.⁷ ............................... B08B 3/00; B08B 7/04
(52) U.S. Cl. ....................... 134/56 R; 134/113; 134/61; 134/902; 134/18
(58) Field of Search ............................ 134/1.3, 18, 113, 134/56 R, 61, 902; 414/935, 936, 937, 938; 198/341.05, 464.2

(56) References Cited

U.S. PATENT DOCUMENTS

| | | |
|---|---|---|
| 1,866,124 A | 7/1932 | Oertli |
| 2,776,512 A | 1/1957 | Guenst |
| 3,093,051 A | 6/1963 | Ritzerfeld et al. |
| 3,436,286 A | 4/1969 | Lange |
| 3,748,177 A | 7/1973 | Neumann et al. |
| 4,836,733 A * | 6/1989 | Hertel et al. ............ 198/341.05 |
| 5,176,158 A | 1/1993 | Ketelhohn et al. |
| 5,487,398 A | 1/1996 | Ohmi et al. |
| 5,649,855 A | 7/1997 | Chikaki |
| 5,779,520 A | 7/1998 | Hayakawa |
| 5,813,733 A * | 9/1998 | Hori et al. .................. 305/172 |
| 5,893,794 A | 4/1999 | Togawa et al. |
| 5,961,380 A | 10/1999 | Togawa et al. |
| 6,221,171 B1 * | 4/2001 | Maekawa et al. ............. 134/32 |

FOREIGN PATENT DOCUMENTS

| | | |
|---|---|---|
| JP | 362125619 | 6/1987 |
| JP | 62-113965 | 7/1987 |
| JP | 000526245 | 2/1993 |
| JP | 406120194 | 4/1994 |
| JP | 05-343499 | * 12/1994 |
| JP | 7-98302 | 10/1995 |

OTHER PUBLICATIONS

An abstract of IBM Technical Disclosure Bulletin V. 28, No. 11, Page 5117–5118, 1986.

* cited by examiner

*Primary Examiner*—Alexander Markoff
(74) *Attorney, Agent, or Firm*—Wenderoth, Lind & Ponack, L.L.P.

(57) ABSTRACT

An apparatus for conveying a workpiece as used to convey the workpiece such as a semiconductor wafer, a glass substrate or liquid crystal panel, between processing apparatuses when the workpiece is processed in the plurality of processing apparatuses. The amount of liquid on a surface of a workpiece is adjusted to a predetermined amount, and the workpiece, which retains the predetermined amount of liquid, is conveyed between processes. The adjusting includes both supplying a sufficient amount of liquid onto the surface of the workpiece, which is in a certain state, and removing a certain amount of liquid from the surface of the workpiece.

13 Claims, 7 Drawing Sheets

APPARATUS FOR CONVEYING A WORKPIECE

This is a Divisional Application of prior U.S. patent application Ser. No. 08/868,889, filed Jun. 4, 1997 now U.S. Pat. No. 6,221,171.

BACKGROUND OF THE INVENTION

1. Field of the Invention

The present invention relates to a method and apparatus for conveying or transporting a workpiece such as a semiconductor wafer, glass substrate or liquid crystal panel, and more particularly to a method and apparatus for conveying a workpiece between processing apparatuses when the workpiece is processed in a plurality of processing apparatuses.

2. Description of the Related Art

Recent rapid progress in semiconductor device integration demands smaller and smaller wiring patterns or interconnections and also narrower spaces between interconnections which connect active areas. One of the processes available for forming such interconnection is photolithography. Though the photolithographic process can form interconnections that are at most 0.5 $\mu$m wide, it requires that surfaces on which pattern images are to be focused by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus, and such a process is called Chemical Mechanical Polishing (CMP) in which the semiconductor wafers are chemically and mechanically polished while supplying an abrasive liquid comprising abrasive grains and chemical solution such as alkaline solution.

When semiconductor wafers are processed, small particles such as particles of semiconductor material, dust particles, crystalline protrusive particles, or the like often tend to be attached to the semiconductor wafers being processed. If a particle greater than the distance between interconnections exists on a semiconductor substrate, then the particle will short-circuit interconnections on the semiconductor substrate. Therefore, any undesirable particles on a semiconductor substrate have to be sufficiently smaller than the distance between interconnections on the semiconductor substrate. Such a problem and a requirement hold true for the processing of other workpieces including a glass substrate to be used as a mask, a liquid crystal display, and so on. To meet the above requirement, there have been practiced some cleaning procedures for removing fine particles or submicron particles from semiconductor wafers.

In this manner, the semiconductor wafers and the like are subjected to a plurality of processes. For example, after polishing, the semiconductor wafers are cleaned one by one and stored in a predetermined location. As a method of physically cleaning semiconductor wafers one by one, there have been scrubbing leaning in which a surface of a semiconductor wafer is scrubbed by a brush of nylon or mohair or a sponge of polyvinyl alcohol (PVA), ultrasonic jet cleaning in which an ultrasonic jet is applied to the surface of the semiconductor wafer, and high pressure water cleaning in which high pressure water is applied to the surface of the semiconductor wafer. In cleaning the semiconductor wafer after polishing, a plurality of cleaning processes using the above two or three methods are applied to the semiconductor wafer. Therefore, it is necessary to convey or transfer the semiconductor wafer between cleaning processes. In this case, the semiconductor wafer is conveyed between cleaning processes in such a state that it is kept wet with liquid. This is because if the semiconductor wafer is not in a wet state before completing the cleaning processes, dust may be attached to the surface of the semiconductor wafer, and if the semiconductor wafer is half-dried, water marks may be formed on the surface of the semiconductor wafer. In particular, if the semiconductor wafer which has been subjected to the CMP process is once dried, the slurry attached to the polished surface of the semiconductor wafer is solidified thereon and is difficult to be removed therefrom, and hence the semiconductor wafer is kept wet with cleaning liquid between cleaning processes.

However, if the wet semiconductor wafer is conveyed at a high speed, as is the case in a recent high through-put-type apparatus, liquid on the surface of the semiconductor wafer may drop from the semiconductor wafer. The dropped liquid, when it is dried and solids contained in the liquid rise up, becomes a source of particles. Further, in the case where different cleaning liquids are used in the cleaning processes, an unexpected chemical reaction may occur upon contact of the different cleaning liquids.

SUMMARY OF THE INVENTION

It is therefore an object o the present invention to provide a method and apparatus for conveying or transferring a workpiece which can convey a workpiece which is kept wet with liquid without causing the liquid t drop from the workpiece.

According to one aspect of the present invention, there is provided a method for conveying a workpiece, comprising: adjusting the amount of liquid on a surface of a workpiece to a predetermined amount, the surface of the workpiece being kept wet by said liquid; and conveying the workpiece which retains said predetermined amount of liquid between processes.

According another aspect of the present invention, there is provided an apparatus for conveying a workpiece, comprising: a conveying device for conveying a workpiece between processes; a liquid supply device for supplying liquid to a surface of the workpiece; and an adjusting device for adjusting the amount of liquid on the surface of the workpiece to a predetermined amount before conveying the workpiece, the surface of the workpiece being kept wet by said liquid.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

A method and apparatus or conveying or transferring a workpiece according to an embodiment of the present invention will be described below with reference to FIGS. 1 through 3.

Figure 1:
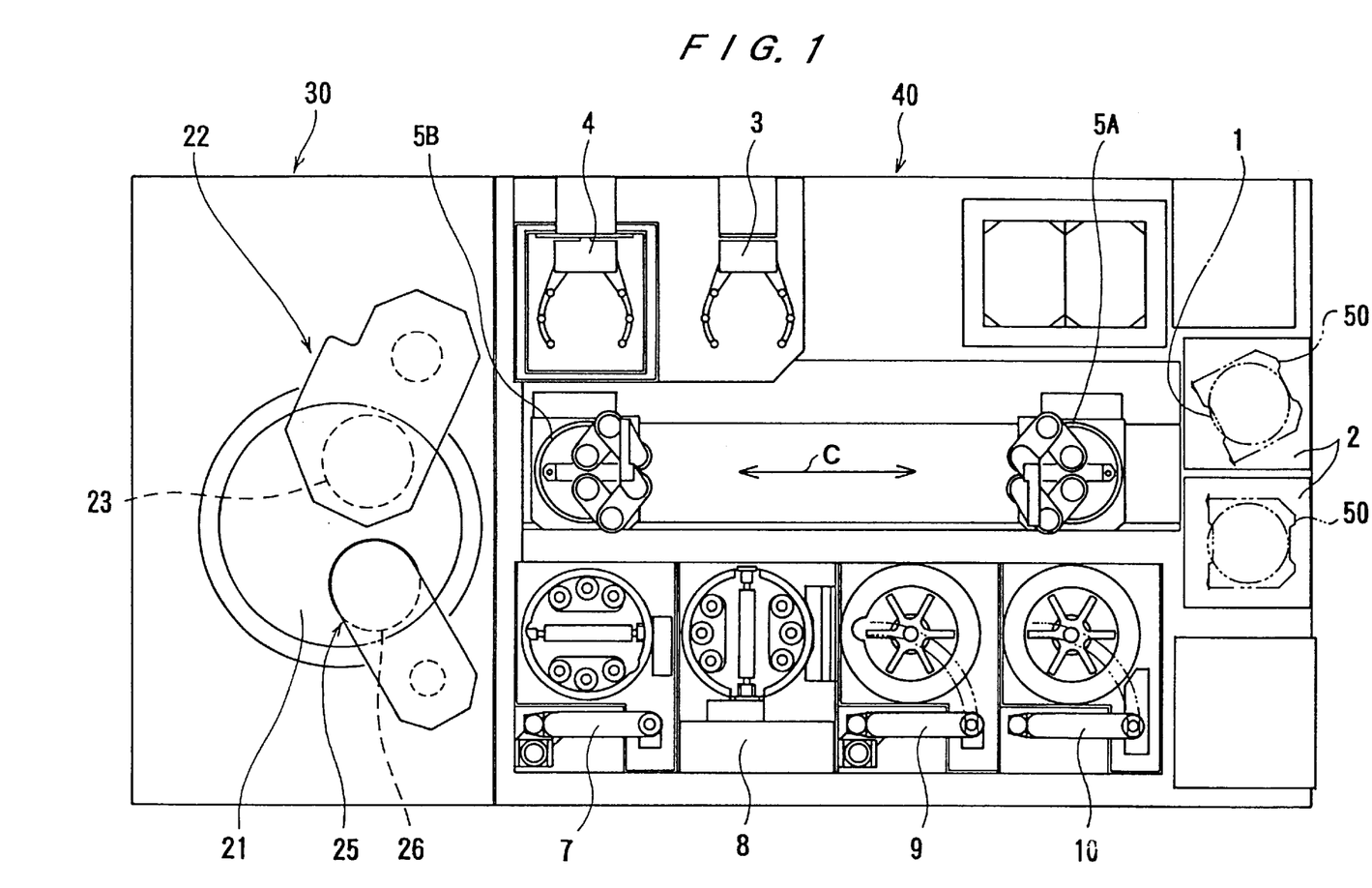
FIG. 1 is a schematic plan view of a polishing apparatus which incorporates a cleaning apparatus and carries out a method for conveying workpiece according to present invention.
Figure 2:
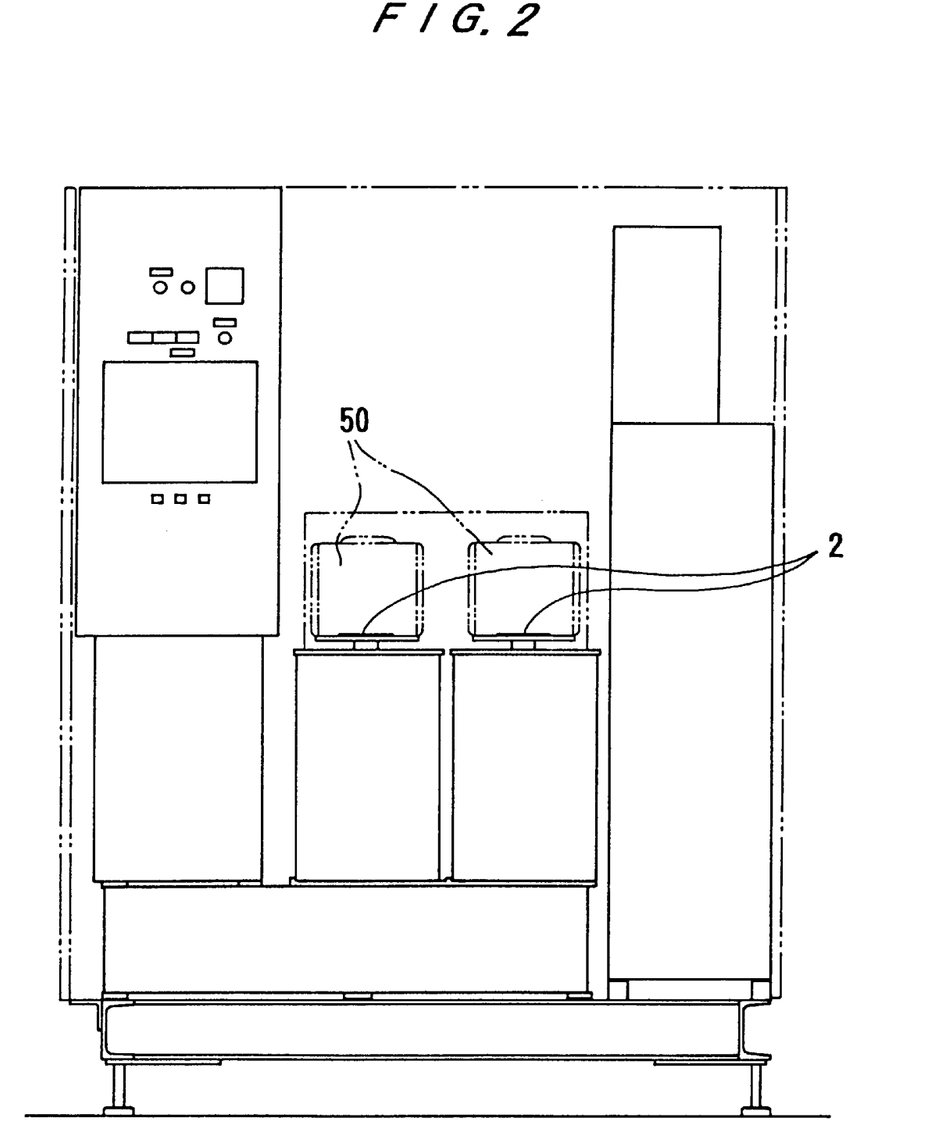
FIG. 2 is a side view of the polishing apparatus shown in FIG. 1.

FIG. 1 shows a polishing apparatus which incorporates a cleaning apparatus and carries out a method for conveying work piece according to the present invention. FIG. 2 is a side view of the polishing apparatus shown in FIG. 1. As shown in FIG. 1, the polishing apparatus comprises a polishing section 30 for polishing a workpiece such as a semiconductor wafer, glass substrate and liquid crystal panel, and a cleaning apparatus 40 for cleaning the workpiece which has been polished in the polishing section 30. The polishing section 30 comprises a central turntable 21, a polishing unit 22 having a top ring 23 for holding a semiconductor wafer 1, and a dressing unit 25 having a dressing tool 26.

The cleaning apparatus 40 comprises a load/unload stage 2 for supplying the semiconductor wafers 1 to be processed and receiving the semiconductor wafers 1 which have been processed, a reversing device 3 for reversing a dry semiconductor wafer 1, a reversing device 4 for reversing a wet semiconductor wafer 1, conveying, transferring or transporting devices 5A, 5B for conveying the semiconductor wafer 1, and four cleaning devices comprising a primary cleaning device 7, a secondary cleaning device 8, a third cleaning device 9 and a fourth cleaning device 10.

The primary cleaning device 7 cleans the semiconductor 1 which has been polished in the polishing section 30. In the prima cleaning device 7, both surfaces of the semiconductor wafer 1 are cleaned by bringing cleaning embers into contact with both surfaces of the semiconductor wafer 1 while supplying cleaning liquid. The secondary cleaning device 8 cleans the semiconductor wafer 1 which has been cleaned in the primary cleaning device 7. The secondary cleaning device 8 has the same structure as the primary cleaning device 7. The third cleaning device 9 cleans the semiconductor wafer 1 which has been cleaned in the secondary cleaning device 8. The detailed structure o the third cleaning device 9 is shown in FIG. 3. The fourth cleaning device 10 cleans the semiconductor wafer 1 which has been cleaned in the third cleaning device 9, and dries it. The fourth leaning device 10 has a rotating mechanism for rotating the semiconductor wafer 1, and a cleaning liquid supply nozzle which is swingable horizontally over the semiconductor wafer 1. In the fourth cleaning device 10, the cleaning liquid which is ultrasonically vibrated is supplied into the surface of the semiconductor wafer 1 from the cleaning liquid supply nozzle while rotating the semiconductor wafer 1 and swinging the cleaning liquid supply nozzle over the semiconductor wafer 1, and then the semiconductor wafer 1 is dried by spinning the semiconductor wafer at a high speed after stopping supply of the cleaning liquid and stopping swinging of the cleaning liquid supply nozzle.

In the polishing apparatus shown in FIG. 1, when a cassette 50 which houses a plurality of semiconductor wafers 1 to be polished is set in the load/unload stage 2, the conveying device 5A takes a semiconductor wafer 1 out of the cassette 50, and transfers the semiconductor wafer 1 to the reversing device 3. After the semiconductor wafer 1 is reversed, i.e., turned upside down by the reversing device 3, it is received by the conveying device 5B, and then placed onto a transfer device (not shown) in the polishing section 30 by the conveying device 5B.

Thereafter, the semiconductor wafer 1 is transferred to the top ring 23 which has moved to a position above the transfer device. The top ring 23 holding the semiconductor wafer 1 is moved over the turntable 21, and presses the semiconductor wafer 1 against the polishing surface on the turntable 21. While the turntable 21 and the top ring 23 are rotated independently of each other, the lower surface of the semiconductor wafer 1 is polished to a flat mirror finish. At this time, the abrasive liquid is supplied through a supply nozzle (not shown) onto the polishing surface on the turntable 21. After the semiconductor wafer 1 is polished, the top ring 23 holding the semiconductor wafer 1 is moved back over the transfer device, and transfers the polished semiconductor wafer 1 onto the transfer device.

The semiconductor wafer 1 placed on the transfer device is then held by the conveying device 5B, and transferred therefrom to the reversing device 4 which in turn reverses the semiconductor wafer 1. The reversed semiconductor wafer 1 is transferred successively to the primary, secondary, third and fourth cleaning devices 7, 8, 9 and 10 by the conveying devices 5B and 5A. In the primary through fourth cleaning devices 7–10, the semiconductor wafer 1 is cleaned while supplying cleaning liquid such as pure water, and finally dried in the fourth cleaning device 10. The cleaned and dried semiconductor wafer 1 is then returned to the cassette 50 in the load/unload stage 2 by the conveying device 5A.

Figure 3:
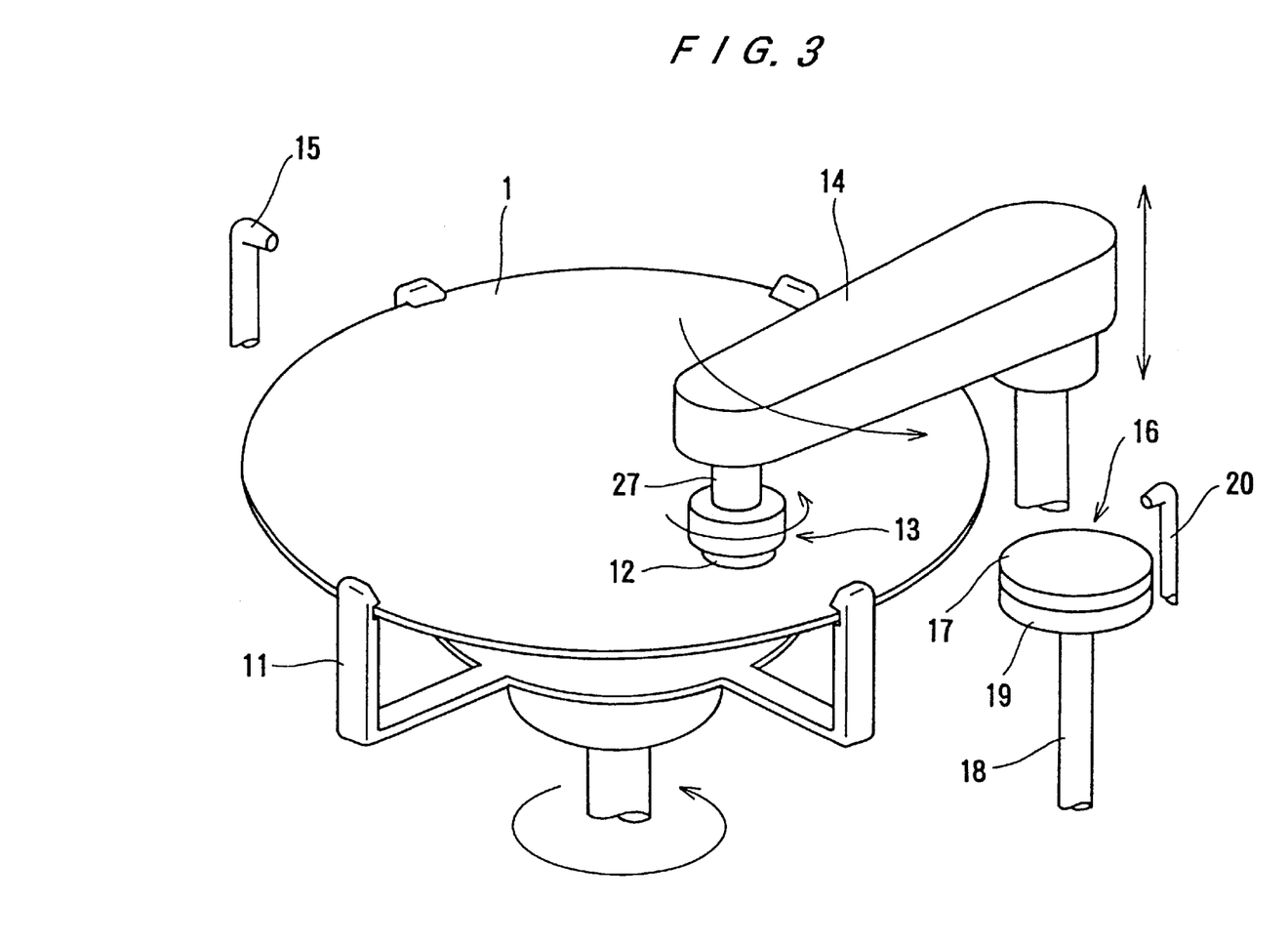
FIG. 3 is a perspective view showing a cleaning device in the cleaning apparatus shown in FIG. 1.

FIG. 3 shows an example of a cleaning device which is applicable to the primary through fourth cleaning devices 7–10. As shown in FIG. 3, the cleaning device comprises a spinning chuck 11 for holding a semiconductor wafer 1 and rotating the semiconductor wafer 1 in a horizontal plane at a predetermined speed, a rotatable cleaning tool 13 incorporating a cleaning member 12 for cleaning a surface of the semiconductor wafer 1, a vertically movable swing arm 14 supporting on its free end the cleaning tool 13 for moving the cleaning tool 13 over the semiconductor wafer 1 supported by the spinning chuck 11, a cleaning liquid nozzle 15 for supplying a cleaning liquid onto a surface, to be cleaned, of the semiconductor wafer 1, and a self-cleaning stage 16 for self-cleaning the cleaning member 12. The cleaning tool 13 is rotatably supported through a rotating shaft 27 by the forward end of the swing arm 14 and is rotatable at a predetermined speed by a rotating mechanism (not shown) provided in the swing arm 14.

The self-cleaning stage 16 comprises a stage 19 having a horizontal upper surface, a support 18 for supporting the stage 19, a cleaning plate 17 attached to the upper surface of the stage 19 and made of, for example, quartz for allowing the cleaning member 12 to contact therewith, and a nozzle 20 for supplying a cleaning liquid to the cleaning member 12 on the cleaning plate 17. In the self-cleaning stage 16, the cleaning tool 13 is positioned above the self-cleaning stage 16 by swing the swing arm 14, and lowered to bring the cleaning member 12 in contact with the cleaning plate 17. The cleaning member 12 is self-cleaned by pressing the cleaning member 12 against the cleaning plate 17 at a certain pressure while the cleaning member 12 is rotated and the cleaning liquid is supplied from the nozzle 20 to the cleaning plate 17.

In the polishing apparatus, as described above, the semiconductor wafer 1 to be processed is conveyed from the load/unload stage 2 to the reversing device 3 by the conveying device 5A. After the semiconductor wafer 1 is turned upside down by the reversing device 3, it is conveyed to the polishing section 30 by the conveying device 5B, and then polished in the polishing section 30. After the semiconductor wafer 1 is polished, it is conveyed to the reversing device 4 by the conveying device 5B. In the reversing device 4, the semiconductor wafer 1 is reversed while it is rinsed by pure water and is kept wet. Then, the semiconductor wafer 1 is successively fed to the primary and secondary cleaning devices 7 and 8 by the conveying device 5B. Further, the semiconductor wafer 1 is successively fed to the third and fourth cleaning device 9 and 10 by the conveying device 5A. The conveying devices 5A and 5B convey the semiconductor wafer 1 in such a state that the semiconductor wafer 1 is horizontally held so as not to cause pure water on the semiconductor wafer 1 to drop from the semiconductor wafer 1. The semiconductor wafer 1 is finally dried in the fourth cleaning device 10, and then returned to the cassette 50 in the load/unload stage 2 by the conveying device 5A.

Next, a cleaning process in each of the cleaning devices 7–10 will be described below with reference to FIG. 4.

After pretreatment is carried out, the semiconductor wafer 1 to be cleaned is fed to the spinning chuck 11 (see FIG. 3) by an arm of the conveying device 5A (or 5B) with the surface, to be cleaned, facing upwardly (st1). The semiconductor 1 held by the spinning chuck 11 is rotated at a predetermined speed by the spinning chuck 11, and a cleaning liquid is supplied from the cleaning liquid nozzle 15 onto the center of the semiconductor wafer 1 to start cleaning of the semiconductor wafer 1 (st2).

The swing arm 14 is lifted to take the cleaning tool 13 out of the self-cleaning stage 16, and then turned to move the cleaning tool 13 to a position above the center of the semiconductor wafer 1. Thereafter, the swing arm 14 is lowered to bring the cleaning member 12 in contact with the upper surface of the semiconductor wafer 1. The cleaning member 12 of the cleaning tool 13 is pressed by the swing arm 14 against the upper surface of the semiconductor wafer 1 which is supported and rotated by the spinning chuck 11. At this time, the cleaning member 12 is independently rotated by the rotating mechanism in the swing arm 14.

Then, the swing arm 14 is turned to angularly move the cleaning member 12 from the center of the semiconductor wafer 1 toward an outer circumferential edge of the semiconductor wafer 1 at a certain speed, thereby scrubbing the upper surface of the semiconductor wafer 1. When the cleaning member 12 has reached the outer circumferential edge of the semiconductor wafer 1, the swing arm 14 is stopped and then lifted to bring the cleaning member 12 out of contact with the upper surface oft e semiconductor wafer 1, thus completing one cycle of a scrubbing operation. The scrubbing operation is repeated by moving the swing arm 14 again radially toward the center of the semiconductor wafer 1. After completing the cleaning process, the swing arm 14 is lifted and the rotation of the spinning chuck 11 is stopped (st3).

Figure 5:
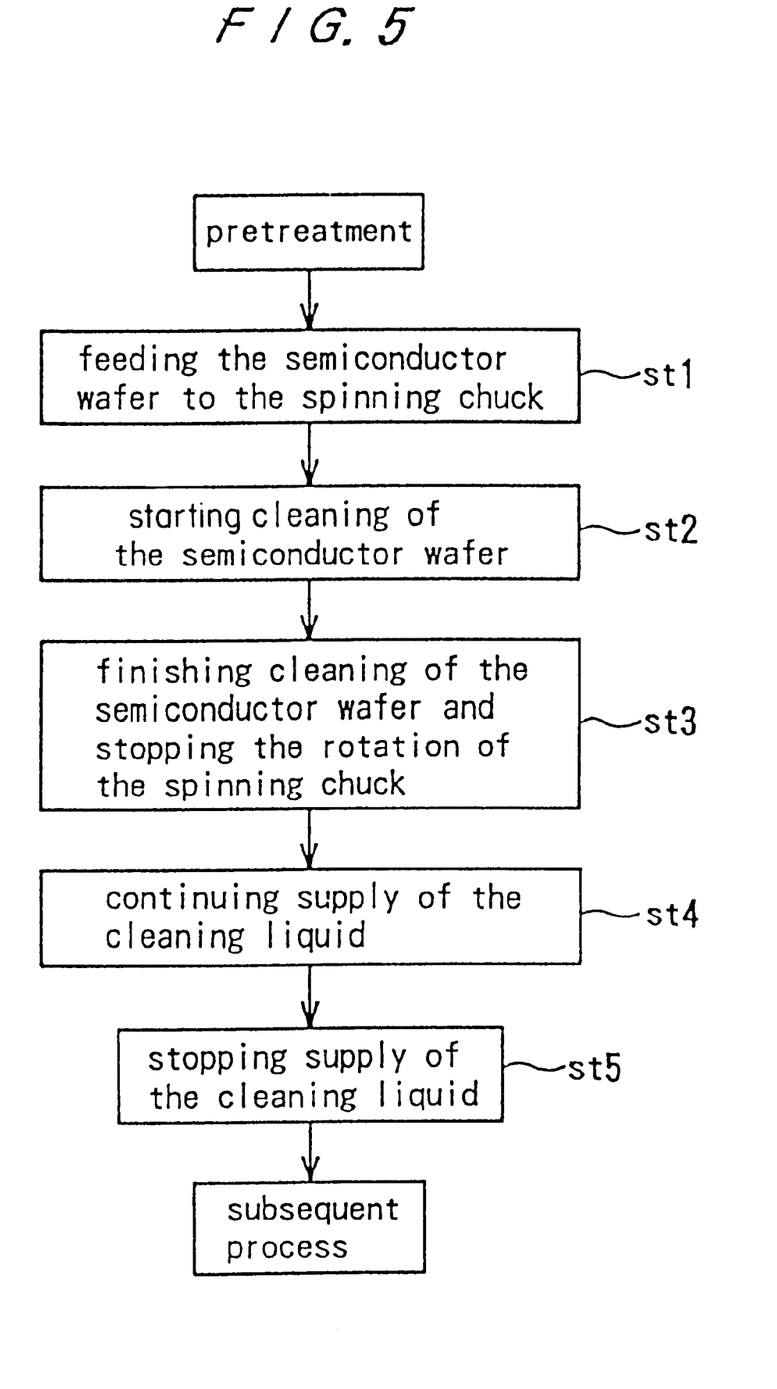
FIG. 5 is a flow chart showing steps of conventional cleaning processes.

According to a conventional conveying method shown in FIG. 5, after the cleaning process is finished and the rotation of the semiconductor wafer 1 is stopped (st3), the cleaning liquid continues to be supplied from the cleaning liquid nozzle 15 to the semiconductor wafer 1 for a certain period of time (st4), and then supply of the cleaning liquid is stopped (st5). This is because the semiconductor wafer 1 has to be kept wet all the time, and if the supply of the cleaning liquid is stopped before stopping the rotation of the semiconductor wafer 1, the cleaning liquid is completely removed from the semiconductor wafer 1.

Figure 4:
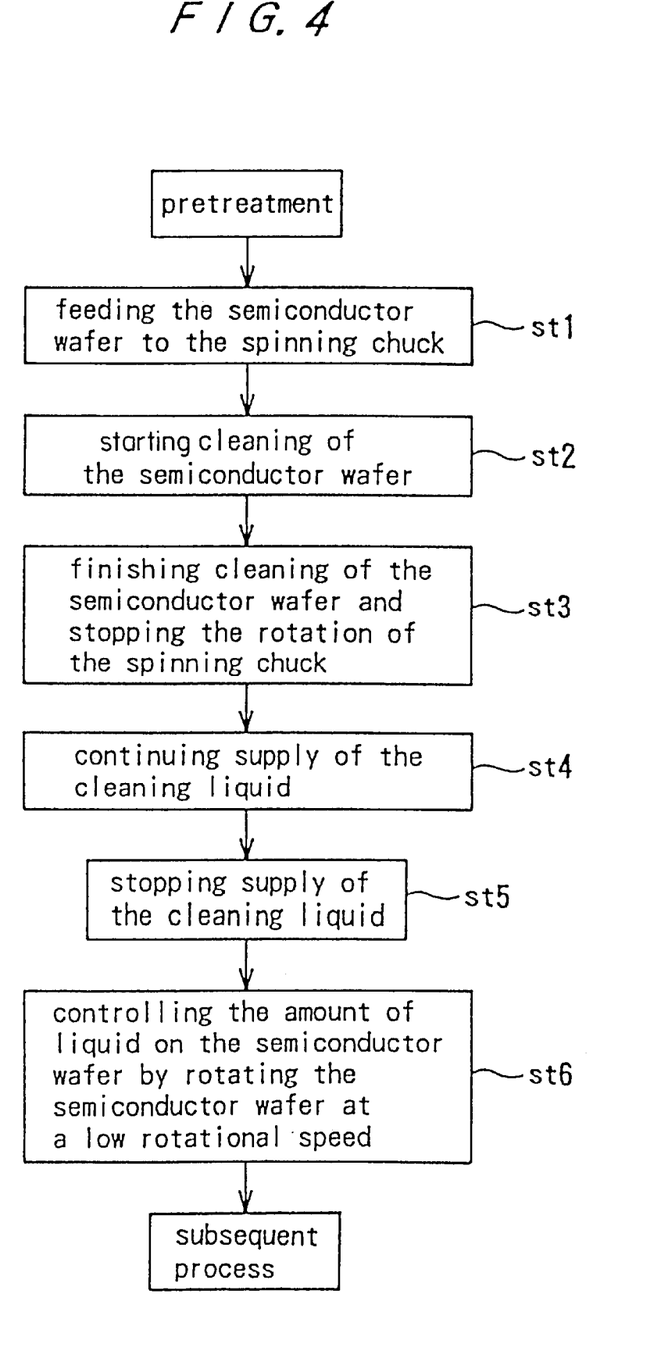
FIG. 4 is a flow chart showing steps of the cleaning processes.

On the other hand, according to the present invention shown in FIG. 4, after the cleaning process is completed and the rotation of the semiconductor wafer 1 is stopped (st3), the cleaning liquid continues to be supplied to the semiconductor wafer 1 (st4). These steps in the present invention are the same as those of the conventional method. However, in the present invention, before the conveying device 5A (or 5B) conveys the semiconductor wafer 1, the cleaning liquid is partly removed from the semiconductor wafer 1 to adjust the amount of cleaning liquid on the semiconductor wafer 1 by a physically removing method. That is, after the supply of the cleaning liquid is stopped and rinsing is stopped (st5), the semiconductor wafer 1 is rotated at a predetermined rotational speed lower than that in the cleaning process (st6). In this manner, the semiconductor wafer 1 retains an optimum amount of cleaning liquid thereon so that the surface of the semiconductor wafer is kept wet and the cleaning liquid does not drop from the surface while it is on the standby condition or is conveyed. Further, the rotation of the semiconductor wafer 1 is stopped, and the semiconductor wafer 1 is taken out of the spinning chuck 11 by the conveying device 5B or 5A, and then transferred to a subsequent processing apparatus. In the case where a long period time is required at the standby condition, the semiconductor wafer is rotated at a low rotational speed for a predetermined time, and the rotation of the semiconductor wafer 1 is stopped and the standby condition continues. Before conveying the semiconductor wafer 1, the removal of the cleaning liquid from the semiconductor wafer 1 is carried out by the rotation of the semiconductor wafer 1 at a low rotational speed, thereby causing the cleaning liquid on the semiconductor wafer 1 to drop from the semiconductor wafer 1. That is, by the rotation of the semiconductor wafer 1, the cleaning liquid moves radially outwardly on the semiconductor wafer 1 by the centrifugal force and drops from the outer circumferential edge of the semiconductor wafer 1. The desired and constant amount of liquid can be left on the semiconductor wafer 1 by keep the rotational speed of the semiconductor wafer 1 and the time for rotation constant.

The rotational speed of the spinning chuck 11 can be easily controlled by using an AC servomotor. According to an experiment, when the semiconductor wafer 1 having an oxide layer which had been polished by CMP as rotated at a rotational speed of 500 rpm for five seconds, the cleaning liquid did not drop from the semiconductor wafer and the surface of the semiconductor wafer was kept we while it was conveyed. Further, the semiconductor wafer was prevented from being dried and there was no chance of generating particles As a method for controlling the amount of liquid on the semiconductor wafer, the semiconductor wafer 1 may be rotated in forward and reverse directions. That is, the semiconductor wafer 1 is rotated in a clockwise direction and then in a counterclockwise direction alternately.

Figure 6:
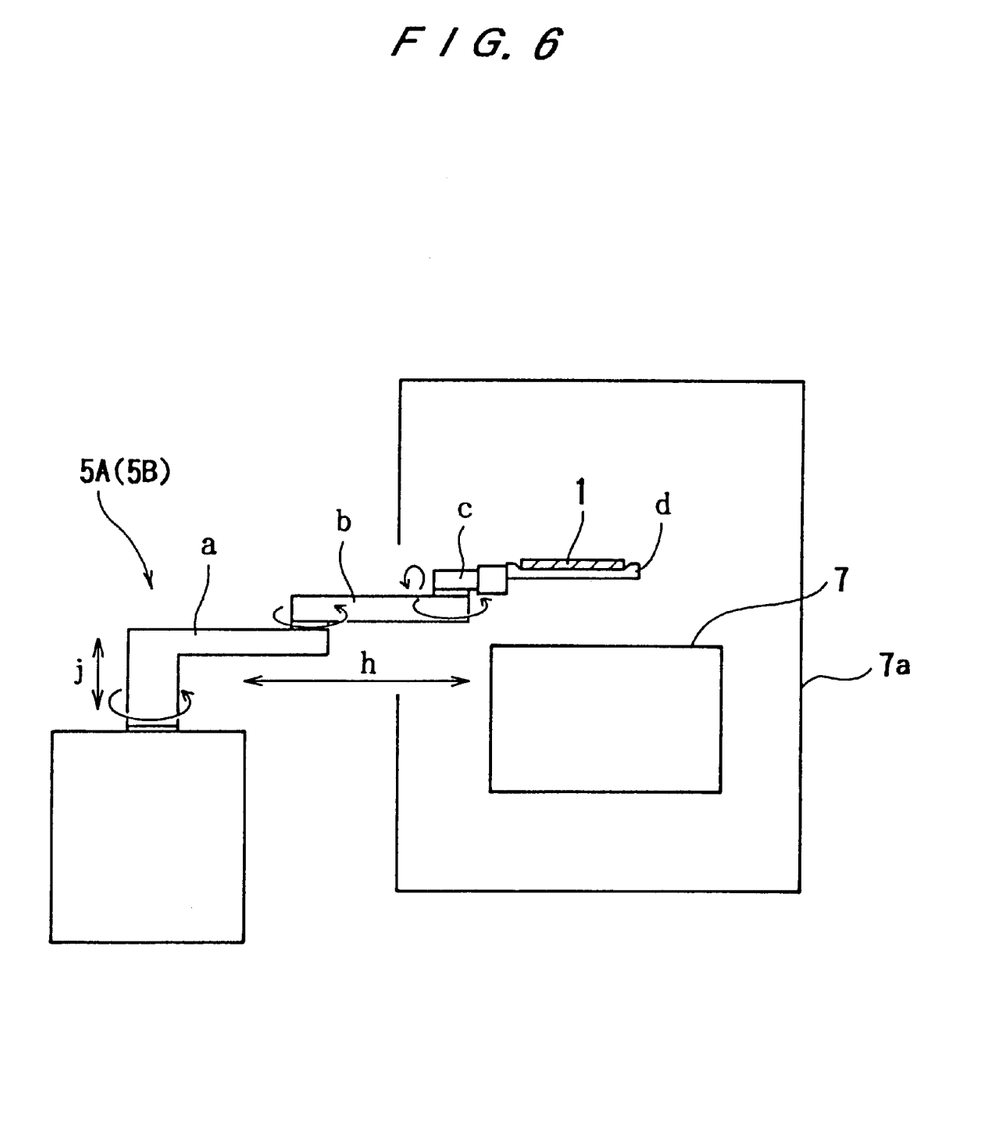
FIG. 6 is a side view showing a conveying device in the cleaning apparatus.

As shown in FIG. 6, means for controlling the amount of liquid on the semiconductor wafer may be provided on the conveying device 5A or 5B. The conveying device 5A or 5B has a pair of movable units, each of which comprises arms a, b and c, and a hand d. The arms a, b and c are independently movable in a horizontal direction h and independently rotatable in a horizontal plane. Further, the arm a is movable in a vertical direction j. The hand d is provided at the forward end of the arm c and is rotatable about a horizontal axis. The hand d holds the semiconductor wafer 1. In the case where the hand d performs an operation for adjusting the amount of liquid on the semiconductor wafer 1 in the cleaning device 7, the cleaning device is preferably housed in a housing 7a so as not to scatter the liquid removed from the semiconductor wafer around the processing apparatuses such as another cleaning device.

According to the conveying device shown in FIG. 6, before conveying the semiconductor wafer 1 which has been cleaned by the cleaning device 7 to a subsequent processing apparatus by the conveying device 5A or 5B, by operating the arms a, b and c or the hand d, the semiconductor wafer 1 is rotated in a horizontal plane at a angle of, for example, 30°, or moved in a horizontal direction (h direction), or tilted by a certain angle with respect to the horizontal plane, whereby a predetermined amount of cleaning liquid is removed from the semiconductor wafer 1.

Further, as a method for controlling the amount of liquid on the semiconductor wafer, the liquid on the semiconductor wafer 1 is wiped by the cleaning member 12 without applying load to the semiconductor wafer 1. Further, the cleaning member 12 may be composed of hydrophilic material such as a brush or a sponge to thereby remove a certain amount of liquid on the semiconductor wafer 1 by liquid absorption.

Figure 7:
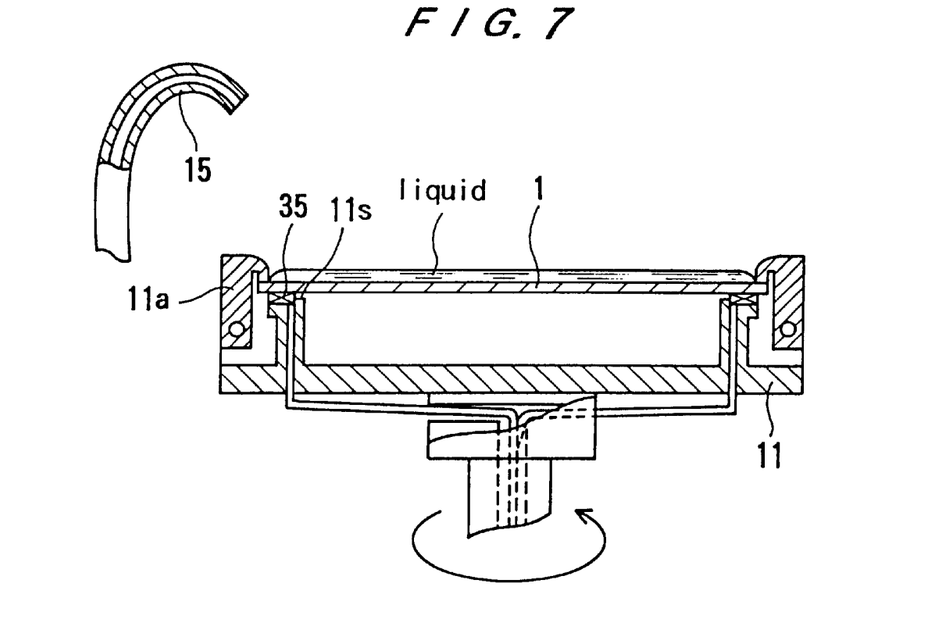
FIG. 7 is a cross-sectional view showing an example for detecting the amount of liquid on the semiconductor wafer.
Figure 8:
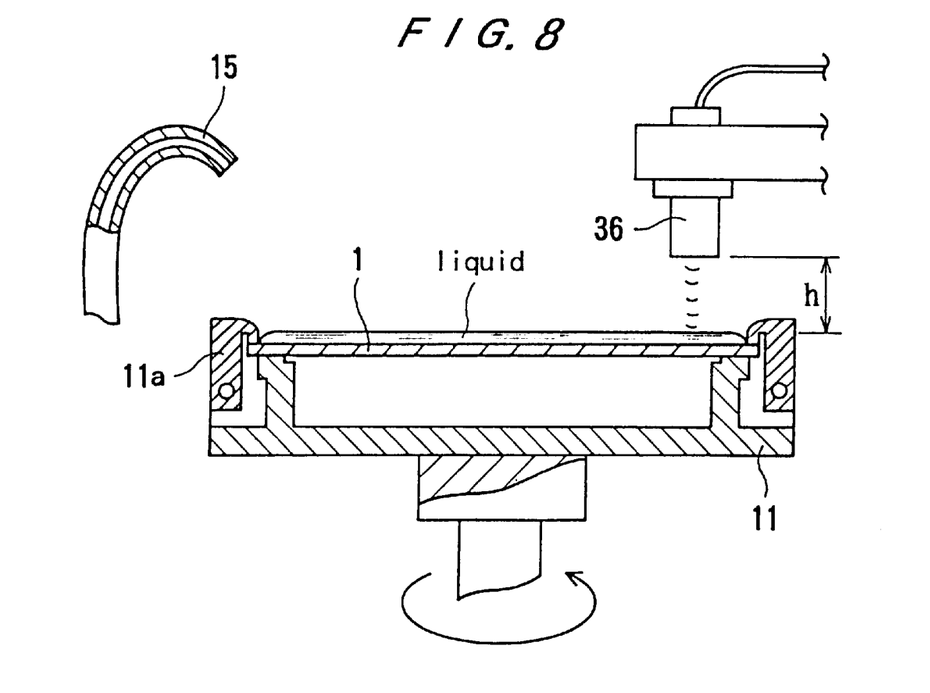
FIG. 8 is a cross-sectional view showing another example for detecting the amount of liquid on the semiconductor wafer.

FIGS. 7 and 8 show examples for detecting the amount of liquid on the semiconductor wafer when controlling the amount of liquid on the semiconductor wafer.

In an example shown in FIG. 7, a load cell 35 is provided on a wafer mounting surface 11s of the spinning chuck 11. The load cell 35 is connected to an external control apparatus through the spinning chuck 11, a shaft and a slip ring (not shown). In this example, after opening clamping members 11a of the spinning chuck 11, the weight of the semiconductor wafer 1 and liquid on the semiconductor wafer 1 is totally measured by the load cell 35. Since the weight of the semiconductor wafer 1 is measured in advance, the amount of liquid on the semiconductor wafer 1 is detected by the load cell 35. According to this embodiment, the amount of liquid on the semiconductor wafer 1 can be precisely measured, and if there is an excess or shortage of liquid on the semiconductor wafer the removal of liquid or supply of liquid from the nozzle 15 is performed to adjust the amount of liquid.

In an example shown in FIG. 8, an ultrasonic displacement sensor 36 is provided above the spinning chuck 11. By the ultrasonic displacement sensor 36, the distance h between the sensor 36 and the upper surface of the liquid on the semiconductor wafer 1 is measured. Since the distance between the sensor 36 and the upper surface of the semiconductor wafer 1 is measured in advance, the thickness of the liquid film on the semiconductor wafer 1 is detected, and hence the amount of liquid on the semiconductor wafer may be detected. The load cell may be provided on the conveying device shown in FIG. 6. Specifically, the load cell may be mounted on the wafer mounting surface of the hand.

According to this embodiment, the amount of liquid on the semiconductor wafer can be precisely measured, aid if there is an excess or shortage of liquid on the semiconductor wafer, the removal of liquid or supply of liquid from the nozzle 15 is performed to adjust the amount of liquid. Further in this embodiment, the clamping members 11a of the spinning chuck 11 are not required to be opened during measurement.

As described above, the present invention offers the following advantages:

Since the amount of liquid on the workpiece can be adjusted so as not to cause the liquid on the workpiece to drop therefrom while the workpiece is prevented from being dried, the liquid is prevented from becoming a contaminant source and from forming water marks during conveying of the semiconductor wafer or the standby condition. Further, the liquid is supplied onto the workpiece which is in a stationary condition which is set to a reference condition, and a certain removing operation is performed from the reference condition. Therefore, the amount of liquid can be easily adjusted by the apparatus having a simple structure.

Although a certain preferred embodiment of the present invention has been shown and described in detail, it should be understood that various changes and modifications may be made therein without departing from the scope of the appended claims.

What is claimed is:

1. A semiconductor device processing apparatus comprising:
   cleaning device operable to clean a semiconductor wafer which has been subjected to a treatment process; and
   a transfer device operable to transfer the semiconductor wafer which has been cleaned by said cleaning device while maintaining the semiconductor wafer in a wet state, said transfer device comprising:
      a wafer holding member operable to hold the semiconductor wafer while maintaining the semiconductor wafer in the wet state, and
      a weight measuring sensor operable to measure a weight of the semiconductor wafer on said wafer holding member.

2. The semiconductor device processing apparatus of claim 1, wherein said weight measuring sensor comprises a load cell.

3. The semiconductor device processing apparatus of claim 2, wherein said wafer holding member comprises a wafer mounting surface and said load cell is provided on said wafer mounting surface.

4. The semiconductor device processing apparatus of claim 1, wherein said cleaning device comprises a cleaning liquid supply.

5. The semiconductor device processing apparatus of claim 1, wherein said weight measuring sensor is operable to detect the amount of liquid on the semiconductor wafer.

6. A semiconductor device processing apparatus comprising:
   a cleaning device operable to clean a semiconductor wafer which has been subjected to a treatment process; and
   a transfer device operable to transfer the semiconductor wafer which has been cleaned by said cleaning device while maintaining the semiconductor wafer in a wet state, said transfer device comprising:
      a wafer holding member operable to hold the semiconductor wafer while maintaining the semiconductor wafer in the wet state, and
      a distance measuring sensor operable to measure a distance between said sensor and a surface of the semiconductor wafer.

7. The semiconductor device processing apparatus of claim 6, wherein said distance measuring sensor is provided above said wafer holding member.

8. The semiconductor device processing apparatus of claim 6, wherein said distance measuring sensor comprises an ultrasonic displacement sensor.

9. The semiconductor device processing apparatus of claim 8, wherein said distance measuring sensor is provided above said wafer holding member.

10. The semiconductor device processing apparatus of claim 6, wherein said cleaning device comprises a cleaning liquid supply.

11. The semiconductor device processing apparatus of claim 6, wherein said distance measuring sensor is operable to detect the thickness of a liquid film on the semiconductor wafer.

12. A semiconductor device processing apparatus comprising:

a cleaning device operable to clean a semiconductor wafer which has been subjected to a treatment process; and a transfer device operable to transfer the semiconductor wafer which has been cleaned by said cleaning device while maintaining the semiconductor wafer in a wet state, said transfer device comprising:

a wafer holding member operable to hold the semiconductor wafer while maintaining the semiconductor wafer in the wet state, and an ultrasonic displacement sensor provided above said wafer holding member.

13. The semiconductor device processing apparatus of claim 12, wherein said ultrasonic displacement sensor is operable to detect the thickness of a liquid film on the semiconductor wafer.

* * * * *

UNITED STATES PATENT AND TRADEMARK OFFICE
CERTIFICATE OF CORRECTION

PATENT NO. : 6,595,220 B2
DATED : July 22, 2003
INVENTOR(S) : Toshiro Maekawa et al.

It is certified that error appears in the above-identified patent and that said Letters Patent is hereby corrected as shown below:

<u>Title page,</u>
Item [30], Foreign Application Priority Data,
please change "7-163942" to -- 9-163942 --.

Signed and Sealed this

Second Day of December, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,595,220 B2
DATED : July 22, 2003
INVENTOR(S) : Toshiro Maekawa et al.

It is certified that error appears in the above-identified patent and that said Letters Patent is hereby corrected as shown below:

<u>Title page,</u>
Item [30], Foreign Application Priority Data,
please change "7-163942" to -- 8-163942 --.

This certificate supersedes Certificate of Correction issued December 2, 2003.

Signed and Sealed this

Twenty-second Day of June, 2004

JON W. DUDAS
*Acting Director of the United States Patent and Trademark Office*